(12) United States Patent
Umemura et al.

(10) Patent No.: US 8,158,490 B2
(45) Date of Patent: Apr. 17, 2012

(54) METHOD FOR PRODUCING GROUP III NITRIDE-BASED COMPOUND SEMICONDUCTOR DEVICE

(75) Inventors: Toshiya Umemura, Aichi-ken (JP); Masahiro Ohashi, Aichi-ken (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 41 days.

(21) Appl. No.: 12/662,075

(22) Filed: Mar. 30, 2010

(65) Prior Publication Data

US 2010/0248404 A1 Sep. 30, 2010

(30) Foreign Application Priority Data

Mar. 31, 2009 (JP) .................. 2009-085437

(51) Int. Cl.
*H01L 21/30* (2006.01)
*H01L 21/46* (2006.01)

(52) U.S. Cl. ......... 438/458; 257/E21.108; 257/E21.117; 257/E21.441; 257/E21.451; 257/E21.596; 257/E21.601; 438/455; 438/462; 438/463; 438/464; 438/604

(58) Field of Classification Search .............. 438/455, 438/458, 462–464, 604; 257/E21.108, E21.117, 257/E21.441, E21.451, E21.596, E21.601
See application file for complete search history.

(56) References Cited

U.S. PATENT DOCUMENTS

| 6,818,531 | B1 | 11/2004 | Yoo et al. |
| 2004/0248377 | A1 | 12/2004 | Yoo et al. |
| 2008/0210955 | A1 | 9/2008 | Uemura et al. |
| 2010/0009515 | A1* | 1/2010 | Wen et al. ............. 438/458 |

FOREIGN PATENT DOCUMENTS

| JP | 2004-363532 A | 12/2004 |
| JP | 2008-186959 A | 8/2008 |

OTHER PUBLICATIONS

Kelly et al., "Optical patterning of GaN film," Appl. Phys. Lett., vol. 69, 1996, pp. 1749-1751.

* cited by examiner

*Primary Examiner* — Asok Sarkar

(74) *Attorney, Agent, or Firm* — McGinn IP Law Group, PLLC

(57) ABSTRACT

A method for producing a Group III nitride-based compound semiconductor device includes, before bonding a support substrate to an epitaxial layer formed on an epitaxial growth substrate, forming trenches in such a manner as to extend from the top surface of a stacked structure including the epitaxial layer to at least the interface between the epitaxial growth substrate and the bottom surface of the epitaxial layer. The trenches divide the epitaxial layer into extended device areas which encompass respective product device structures, and stress relaxation areas. A plurality of laser irradiations are performed for laser lift-off such that, after each laser irradiation, the expanded device areas and the stress relaxation areas are formed by a laser-irradiated area and a laser-unirradiated area, and a strip-shaped laser-unirradiated stress relaxation area is formed at a boundary between the laser-irradiated area and the laser-unirradiated area.

4 Claims, 8 Drawing Sheets

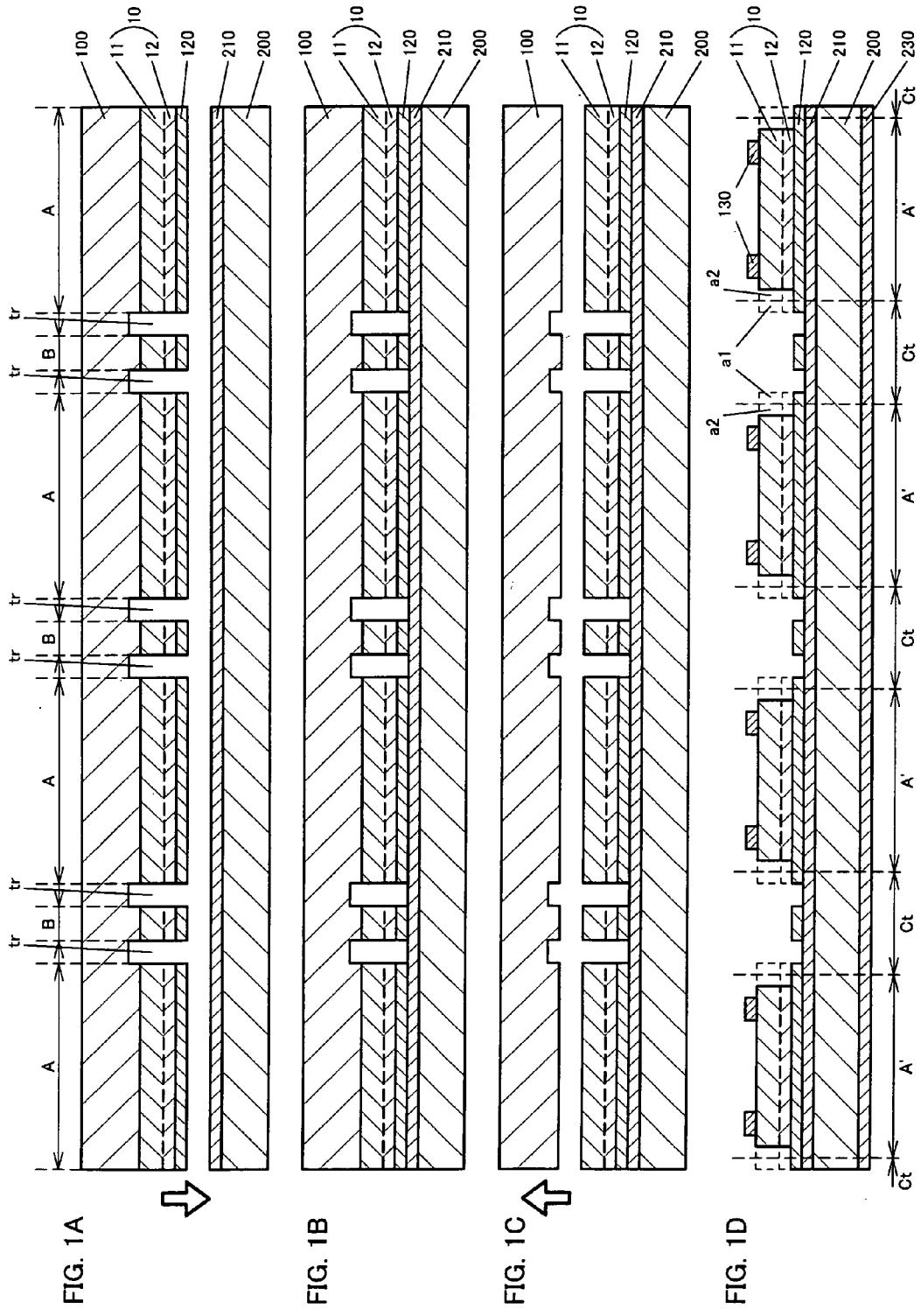

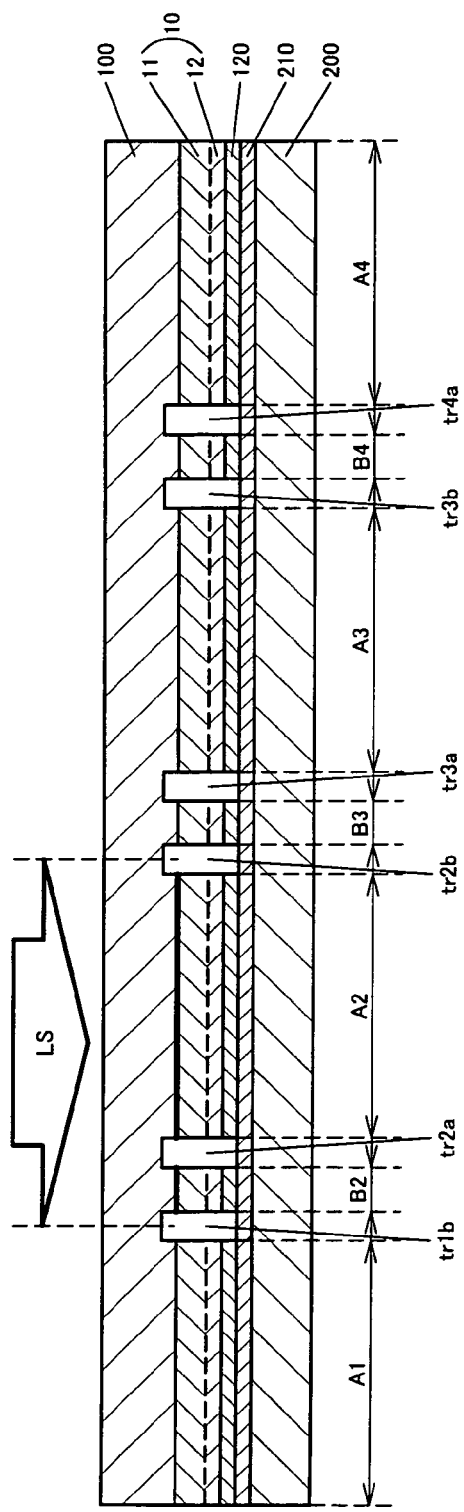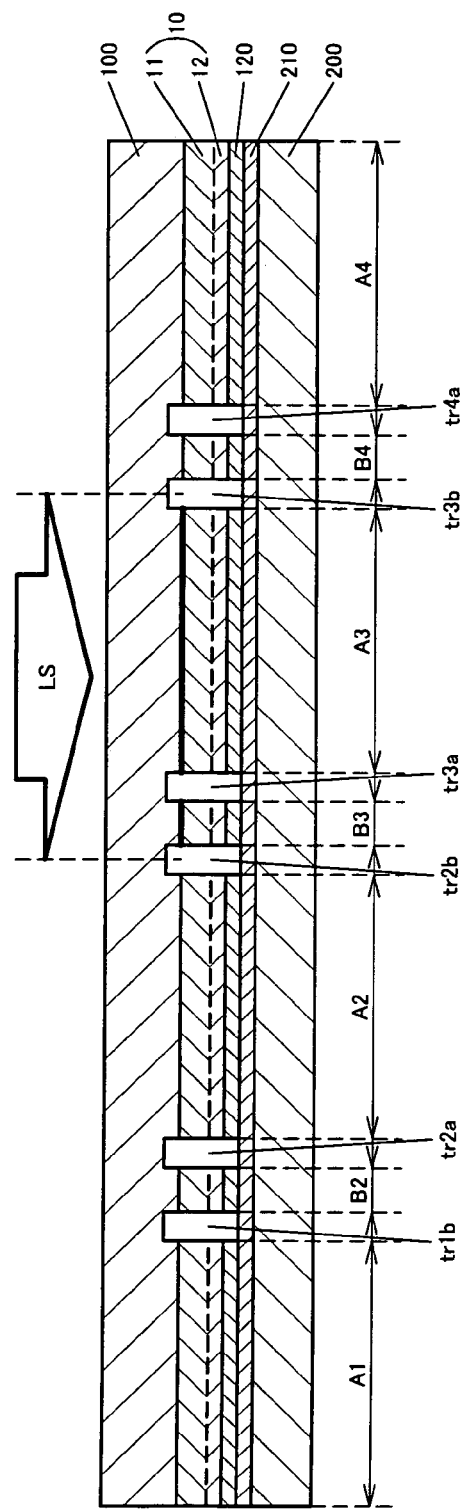

METHOD FOR PRODUCING GROUP III NITRIDE-BASED COMPOUND SEMICONDUCTOR DEVICE

BACKGROUND OF THE INVENTION

1. Field of the Invention

The present invention relates to a method for producing a Group III nitride-based compound semiconductor device. More particularly, the present invention relates to a method for producing a Group III nitride-based compound semiconductor device employing the so-called laser lift-off technique, in which a Group III nitride-based compound semiconductor is epitaxially grown on a substrate made of a material different from Group III nitride-based compound semiconductor (hereinafter the substrate may be referred to as a "hetero-substrate") to form a device structure; a conductive support substrate is bonded, via a conductive layer (e.g., a metal layer or a solder layer), to the uppermost layer of the device structure; and the hetero-substrate is removed by decomposing, through laser irradiation, a Group III nitride-based compound semiconductor thin layer in the vicinity of the interface between the Group III nitride-based compound semiconductor and the hetero-substrate. The present invention is particularly effective for a method for producing a Group III nitride-based compound semiconductor light-emitting device having an n-type layer and a p-type layer which sandwich a pn junction structure or an active layer.

2. Background Art

By virtue of a laser lift-off technique initially demonstrated by Kelly et. al. and described in Appl. Phys. Lett., vol. 69, 1996, p.p. 1749-1751, a light-emitting device or another Group III nitride-based compound semiconductor can be separated from a substrate used for epitaxial growth and then bonded to a conductive support substrate. This technique realizes, for example, formation of an electrode on the bottom surface of a support substrate of a light-emitting diode. Also, this technique realizes production of a light-emitting device having facing opposite electrodes (i.e., positive and negative electrodes) on both the bottom surface of a substrate and the uppermost surface of an epitaxial layer, similar to the case of a GaAs light-emitting device.

Provision of positive and negative electrodes in such a manner that they face each other via a light-emitting layer sandwiched therebetween is advantageous in that the area of a light-emitting region can be regulated to be approximately equal to the horizontal area of a support substrate, and that light extraction performance per unit device can be improved by virtue of attainment of light emission having uniform intensity. Prior art of the present invention is described in Japanese Patent Application Laid-Open (kokai) No. 2008-186959 filed by the applicant of the present invention.

In the laser lift-off technique, when, for example, an interfacial thin-film portion of a gallium nitride (GaN) layer which faces a sapphire substrate via a buffer layer formed of aluminum nitride is irradiated with a laser beam having an appropriate wavelength, GaN is decomposed into molten gallium (Ga) and nitrogen ($N_2$) gas. When decomposition of the gallium nitride (GaN) layer is performed sequentially from a peripheral portion of a wafer, molten gallium (Ga) and nitrogen ($N_2$) gas which are produced through the decomposition can be discharged to the periphery of the wafer.

However, for increasing irradiation energy per irradiation area, irradiating the entire wafer with laser light at a time is not preferred. Thus, for example, laser irradiation may be performed as follows. The range of a single laser irradiation is adjusted to, for example, a square measuring 0.1 mm to several mm square, and the wafer is divided into the squares. Laser irradiation is performed in a scanning manner from a peripheral portion of the wafer.

Since the volume of nitrogen gas generated in a single laser irradiation is large, the generated nitrogen gas induces large stress in such a direction as to separate an epitaxial growth substrate and an epitaxial layer bonded to a support substrate from each other.

In practice, the thickness of a GaN layer to be decomposed by ultraviolet light is considered to be on the order of several nm to several tens of nm. Thus, in a laser-irradiated area, the gap between the GaN layer and the hetero-substrate is very narrow. Meanwhile, the volume of nitrogen gas generated by laser irradiation is very large. Accordingly, if the generated nitrogen gas is not efficiently discharged outward, large stress is imposed on a region of bond between the epitaxial layer and the hetero-substrate.

In order to cope with the above problem, there is a technique in which trenches for discharging nitrogen gas are formed along, for example, device separation lines, and then laser lift-off is performed. First, this technique will be described.

FIGS. 7A to 7D are sectional views showing a conventional process of laser lift-off.

An n-type layer 11 and then a p-type layer 12 are epitaxially grown on an epitaxial growth substrate 100, thereby forming an epitaxial layer 10. A light-emitting area L is formed in an MQW structure, but is merely represented by the thick broken line in FIGS. 7A to 7D.

Next, trenches tr are formed by laser irradiation, for use as air vents at the time of laser lift-off. The trenches tr divide the epitaxial layer 10 into a large number of expanded device areas S. The expanded device areas S encompass respective device areas S', which will be described below, and are greater in size than the device areas S'. Each of the expanded device areas S and device areas S' has a rectangular shape (including a square shape) as viewed in plane.

Next, a conductive multilayer film 120 is formed on the surface of the p-type layer 12. The top surface of the conductive multilayer film 120 (in FIG. 7A, the bottom surface most distant from the p-type layer 12) is of a solder layer. In formation of the conductive multilayer film 120, the conductive multilayer film 120 may cover the previously formed trenches tr, so long as the trenches tr can serve as air vents for outward communication, or outward communication can be established at the time of laser irradiation for laser lift-off.

In this manner, there is formed the wafer appearing on the upper side of FIG. 7A which has the trenches tr and in which the epitaxial layer 10 and the conductive multilayer film 120 are formed on the epitaxial growth substrate 100. The epitaxial layer 10 bonded to the epitaxial growth substrate 100 is divided into a plurality of the expanded device areas S by the trenches tr.

Next, a conductive multilayer film 210 is formed on a support substrate 200 formed from a conductive material. The top surface of the conductive multilayer film 210 is of a solder layer (see the lower side of FIG. 7A).

The epitaxial growth substrate 100 having the epitaxial layer 10, and the support substrate 200 are bonded together such that the conductive multilayer films 120 and 210, whose top layers are solder layers, face each other (FIG. 7B).

Next, laser lift-off is performed. A thin-film portion of the n-type layer 11 of the epitaxial layer 10 in the vicinity of the interface between the n-type layer 11 and the epitaxial growth substrate 100 is irradiated with laser light so as to decompose the thin-film portion of the n-type layer 11. At this time, the area of a single laser irradiation (shot area, LS) encompasses a single expanded device area S. In this manner, the entire thin-film portion of the n-type layer 11 in the vicinity of the interface between the n-type layer 11 and the epitaxial growth substrate 100 of sapphire is decomposed for debonding, thereby removing the epitaxial growth substrate 100 (FIG. 7C).

Next, chip peripheries s1 and s2 of the epitaxial layer 10 are removed by dry etching. Then, n electrodes 130 are formed.

A conductive multilayer film 230 is formed on the back side of the support substrate 200 of silicon.

In this manner, the structure shown in FIG. 7D is completed. Cutting allowance areas Ct defined by the broken lines are removed, thereby yielding individual devices.

Each of the device areas S' in FIG. 7D is smaller in size by the chip periphery s1 of the epitaxial layer 10 than the expanded device area S in FIG. 7A. Each of the cutting allowance areas Ct encompasses the chip periphery s1 and the trench tr. The chip periphery s2 is an area of the epitaxial layer 10 which is removed for allowing formation of an insulating protection film for preventing a short circuit between the n electrodes 130 and an area on a p side extending from the p-type layer 12 to the conductive multilayer film 230.

Meanwhile, the following problem associated with each of laser irradiations in FIG. 7B has been found. In each laser irradiation, stress is generated in a laser-unirradiated area, resulting in crack formation in the epitaxial layer 10 in the laser-unirradiated area. This problem is described below with reference to FIGS. 8A and 8B.

FIG. 8A is a sectional view showing a state in which an expanded device area S2 is under laser irradiation. FIG. 8B is a sectional view showing a state in which an expanded device area S3 is under laser irradiation.

As shown in FIG. 8A, four expanded device areas are denoted by S1, S2, S3, and S4. The expanded device areas S1 and S2 are separated by a trench tr12; the expanded device areas S2 and S3 are separated by a trench tr23; and the expanded device areas S3 and S4 are separated by a trench tr34. Suppose that a laser shot (LS) is performed four times in such a manner as to sequentially encompass the expanded device areas S1, S2, S3, and S4.

In FIG. 8A, the expanded device area S1 has already been laser-irradiated; the expanded device area S2 is under laser irradiation; and the expanded device areas S3 and S4 are laser-unirradiated.

At this time, nitrogen gas is generated as a result of decomposition of a portion of the n-type layer 11 in the expanded device area S2 in the vicinity of the interface between the n-type layer 11 and the epitaxial growth substrate 100. The generated nitrogen gas is discharged through the trenches tr12 and tr23. At this time, very large volume expansion of the nitrogen gas occurs. The epitaxial layer 10 in the expanded device area S1 to the left of the expanded device area S2 under laser irradiation is separated from the epitaxial growth substrate 100. Thus, the epitaxial layer 10 in the expanded device area S1 is free from imposition of large stress thereon. By contrast, the epitaxial layer 10 in the expanded device area S3 to the right of the expanded device area S2 under laser irradiation is bonded to the epitaxial growth substrate 100. Thus, large stress is imposed on the epitaxial layer 10 in the expanded device area S3. Specifically, nitrogen gas is generated as a result of decomposition of a portion of the n-type layer 11 in the expanded device area S2 in the vicinity of the interface between the n-type layer 11 and the epitaxial growth substrate 100. The generated nitrogen gas induces stress in such a direction as to lift the epitaxial growth substrate 100. As a result, a crack is highly likely to be formed, in the vicinity of the trench tr23, in the epitaxial layer 10 in the expanded device area S3 to the right of the expanded device area S2 under laser irradiation. A once-formed crack in the epitaxial layer 10 does not disappear in subsequent processes and is highly likely to progress. In the case of such progress of crack, the crack formed, in the vicinity of the trench tr23, in the epitaxial layer 10 in the expanded device area S3 progresses through the chip periphery s1 in the cutting allowance area Ct in FIG. 7D and then through the chip periphery s2 to be removed by etching, and finally reaches the device area S', thereby greatly impairing device characteristics.

Meanwhile, referring to FIG. 8B, the epitaxial layer 10 in the expanded device area S2 to the left of the expanded device area S3 under laser irradiation is separated from the epitaxial growth substrate 100. Thus, the epitaxial layer 10 in the expanded device area S2 is free from imposition of large stress thereon.

However, in a rare case, since a large amount of nitrogen gas is generated instantaneously in the expanded device area S3, a crack may be formed in the epitaxial layer 10 in the expanded device area S2 separated from the epitaxial growth substrate 100. Particularly, in the case where the support substrate is not sufficiently fixed, stress induced by the generated gas causes vibration of the support substrate, so that a crack is likely to be formed in the epitaxial layer 10.

Japanese Patent Application Laid-Open (kokai) No. 2004-363532 discloses a technique in which laser-irradiated areas of an epitaxial growth substrate, such as a sapphire substrate, are fragmented, thereby removing the epitaxial growth substrate.

In use of the technique disclosed in Japanese Patent Application Laid-Open (kokai) No. 2004-363532, sapphire fragments are scattered. Collecting such fragments is costly.

SUMMARY OF THE INVENTION

Focusing on a wide cutting allowance area Ct which encompasses a trench tr as shown in FIG. 7D, the present inventors have accomplished the present invention.

Accordingly, in a first aspect of the present invention, there is provided a method for producing a Group III nitride-based compound semiconductor device in which a hetero-substrate is used as an epitaxial growth substrate and which comprises stacking an epitaxial layer of a Group III nitride-based compound semiconductor on the epitaxial growth substrate, bonding a support substrate to a top surface of the epitaxial layer via a conductive layer, and removing the epitaxial growth substrate by laser lift-off. The method comprises, before bonding the support substrate to the epitaxial layer formed on the epitaxial growth substrate, forming trenches in such a manner as to extend from a top surface of a stacked structure including the epitaxial layer formed on the epitaxial growth substrate to at least an interface between the epitaxial growth substrate and a bottom surface of the epitaxial layer. The trenches divide the epitaxial layer formed on the epitaxial growth substrate into extended device areas which encompass respective product device structures, and stress relaxation areas. A plurality of laser irradiations are performed for laser lift-off as follows. After each laser irradiation, the expanded device areas and the stress relaxation areas are separated into two areas of a laser-irradiated area and a laser-unirradiated area. A strip-shaped laser-unirradiated stress relaxation area is formed at a boundary between the laser-irradiated area and the laser-unirradiated area.

The hetero-substrate assumed herein is a substrate which does not absorb laser light with which a Group III nitride-based compound semiconductor layer is irradiated for decomposition. From this point of view, use, as the hetero-substrate, of a Group III nitride-based compound semiconductor substrate different in composition from the Group III nitride-based compound semiconductor layer to be decomposed is not excluded.

The expanded device areas and stress relaxation areas assumed herein result from the epitaxial layer being divided in a bond surface between the epitaxial layer and the hetero-substrate. That is, the trenches divide the bond surface between the epitaxial layer and the hetero-substrate, thereby forming the expanded device areas and the stress relaxation areas. The expanded device areas and the stress relaxation areas are of the epitaxial layer. This also holds after separation from the hetero-substrate. Each of the expanded device areas encompasses the epitaxial layer in a product device structure. The epitaxial layer of each of the expanded device areas undergoes removal of a peripheral portion thereof in a later process, whereby the expanded device area becomes a product device area.

The strip-shaped laser-unirradiated stress relaxation area at the boundary is not necessarily a solid laser-unirradiated stress relaxation area, but includes a plurality of laser-unirradiated stress relaxation areas which are separated from one another by trenches and are formed in a strip-shaped fashion. Further, the strip-shaped laser-unirradiated stress relaxation area also includes, for example, a plurality of laser-unirradiated stress relaxation areas, each having a rectangular shape, arranged along a bent line having a plurality of bends.

A second aspect of the invention is directed to a specific embodiment of the production method according to the first aspect, wherein the longitudinal directions of the trenches are in parallel with two mutually perpendicular directions. In this case, each of the expanded device areas and stress relaxation areas has a rectangular shape.

A third aspect of the invention is directed to a specific embodiment of the production method according to the first or second aspect, wherein trenches are formed in two lines in the stress relaxation areas.

A fourth aspect of the invention is directed to a specific embodiment of the production method according to the first or second aspect, wherein trenches are formed in three lines in the stress relaxation areas.

A fifth aspect of the invention is directed to a specific embodiment of the production method according to the second aspect, wherein, a stress relaxation area located between every two adjacent expanded device areas consists of n rectangular areas juxtaposed between the adjacent expanded device areas, where n is an integer equal to or larger than 1; and, as viewed on every four of the expanded device areas, the four expanded device areas being arrayed such that respective vertexes face one another, a stress relaxation area surrounded by the four vertexes consists of $n^2$ rectangular areas. This means that when $2 \leq n$, single stress relaxation area can be divided into a plurality of stress relaxation areas; when n=1, single stress relaxation area exists; i.e., one or more than one strip-shaped stress relaxation areas can be formed between adjacent expanded device areas.

A sixth aspect of the invention is directed to a specific embodiment of the production method according to the fifth aspect, wherein the n is equal to or larger than 2 and a plurality of laser irradiations are performed for laser lift-off such that, in each of the laser irradiations, a stress relaxation area which has been laser-irradiated is present between an expanded device area under laser irradiation and an expanded device area which has been laser-irradiated. As will be described below, this means that a portion of a stress relaxation area is not used as a portion of a strip-shaped laser-unirradiated stress relaxation area at the boundary, but is laser-irradiated and used as a gap between a laser-irradiated expanded device area and an expanded device area under laser irradiation.

When a certain expanded device area becomes a nitrogen gas generation source as a result of laser irradiation, a stress relaxation area bonded to the epitaxial growth substrate is present without fail between the certain expanded device area and an adjacent expanded device area bonded to the epitaxial growth substrate. Thus, stress which is induced by the volume expansion of nitrogen gas generated through laser irradiation and acts in such a direction as to separate the epitaxial growth substrate and the epitaxial layer acts on the stress relaxation area and does not act directly on the adjacent expanded device area bonded to the epitaxial growth substrate. Therefore, there can be restrained the formation of a crack in the adjacent expanded device area bonded to the epitaxial growth substrate.

Since each of the trenches can be formed to have a width and a depth of, for example, 5 µm or greater, the trenches function as discharge paths for nitrogen gas generated in association with laser irradiation for laser lift-off. Since the trench is provided around any laser irradiation area in a two-fold or (n+1)-fold fashion, nitrogen gas can be discharged very effectively. The n is number of separated areas of the stress relaxation area between the adjacent expanded device areas. Thus, the provision of such trenches reduces the discharge of nitrogen gas through a gap on the order of several nm to several tens of nm between the epitaxial growth substrate and the Group III nitride-based compound semiconductor layer separated from the epitaxial growth substrate, thereby preventing crack formation in the separated Group III nitride-based compound semiconductor layer.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which:

FIGS. 1A to 1D are sectional views showing a process for explaining the effects of the present invention;

FIGS. 2A and 2B are sectional views showing the details of FIG. 1B;

DESCRIPTION OF THE PREFERRED EMBODIMENT

Figure 3:
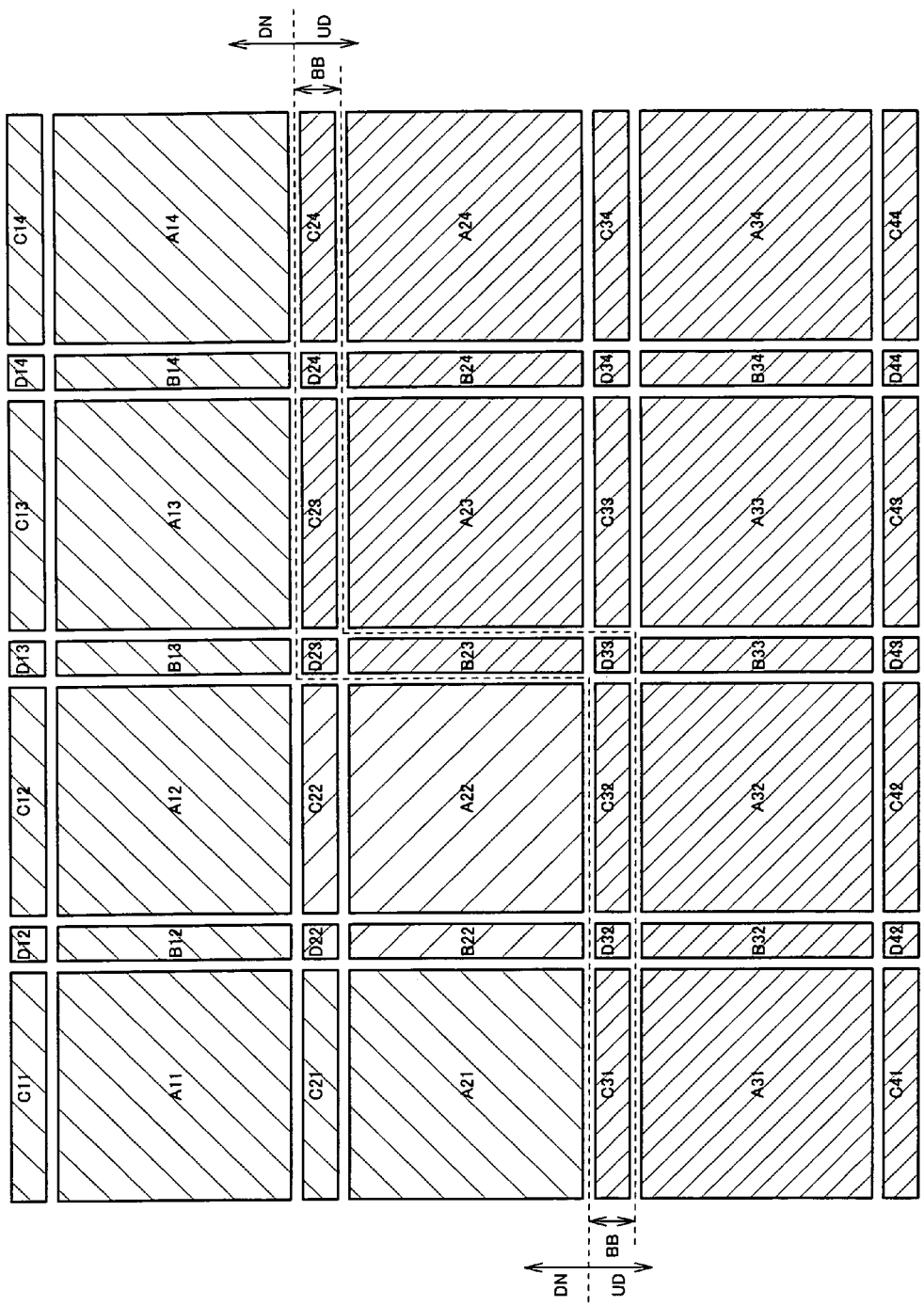
FIG. 3 is a plan view showing an example array of expanded device areas and stress relaxation areas.

The present invention can be applied to a method for producing any Group III nitride-based compound semiconductor device which includes a process of removing an epitaxial growth substrate by use of laser lift-off. A particular example of a Group III nitride-based compound semiconductor device fabricated through application of the present invention is a large-sized LED to which large current is applied. The configuration of a Group III nitride-based compound semiconductor device is arbitrary and is not limited to that of the following embodiment.

Next, the effects of the present invention will be described visually with reference to FIGS. 1A to 1D and FIGS. 2A and 2B.

FIGS. 1A to 1D are sectional views showing a process for explaining the effects of the present invention. FIGS. 1A to 1D correspond to FIGS. 7A to 7D, but differ from FIGS. 7A to 7D in that a combination of two trenches tr and a stress relaxation area B is employed instead of a single trench tr formed between the expanded device areas S.

An n-type layer 11 and then a p-type layer 12 are epitaxially grown on an epitaxial growth substrate 100, thereby forming an epitaxial layer 10. A light-emitting area L is formed in an MQW structure, but is merely represented by the thick broken line in FIGS. 1A to 1D. Next, the trenches tr are formed by laser irradiation, for use as air vents at the time of laser lift-off. The width of each of two trenches tr and the width of the stress relaxation area B located between the two trenches tr are 1/10 or less, more preferably 1/30 or less, the length of one side of an expanded device area A. The expanded device areas A encompass respective device areas A', which will be described below, and are greater in size than the device areas A'. Each of the expanded device areas A, the device areas A', and the stress relaxation areas B has a rectangular shape (including a square shape) as viewed in plane.

Next, a conductive multilayer film 120 is formed on the surface of the p-type layer 12. The top surface of the conductive multilayer film 120 (in FIG. 1A, the bottom surface most distant from the p-type layer 12) is of a solder layer. In formation of the conductive multilayer film 120, the conductive multilayer film 120 may cover the previously formed trenches tr, so long as the trenches tr can serve as air vents for outward communication, or outward communication can be established at the time of laser irradiation for laser lift-off.

In this manner, there is formed the wafer appearing on the upper side of FIG. 1A which has the trenches tr and in which the epitaxial layer 10 and the conductive multilayer film 120 are formed on the epitaxial growth substrate 100. The epitaxial layer 10 bonded to the epitaxial growth substrate 100 is divided into a plurality of the expanded device areas A and the stress relaxation areas B by the trenches tr.

Next, a conductive multilayer film 210 is formed on a support substrate 200 formed from a conductive material. The top surface of the conductive multilayer film 210 is of a solder layer (see the lower side of FIG. 1A).

The epitaxial growth substrate 100 having the epitaxial layer 10, and the support substrate 200 are bonded together such that the conductive multilayer films 120 and 210, whose top layers are solder layers, face each other (FIG. 1B).

Next, laser lift-off is performed. A thin-film portion of the n-type layer 11 of the epitaxial layer 10 in the vicinity of the interface between the n-type layer 11 and the epitaxial growth substrate 100 is irradiated with laser light so as to decompose the thin-film portion of the n-type layer 11. At this time, the area of a single laser shot (LS) encompasses a single expanded device area A and a single stress relaxation area B in the side near to the completed expanded device area A of decomposition. In this manner, the entire thin-film portion of the n-type layer 11 in the vicinity of the interface between the n-type layer 11 and the epitaxial growth substrate 100 of sapphire is decomposed for debonding, thereby removing the epitaxial growth substrate 100 (FIG. 1C).

Next, chip peripheries a1 and a2 of the epitaxial layer 10 are removed by dry etching. Then, n electrodes 130 are formed.

A conductive multilayer film 230 is formed on the back side of the support substrate 200 of silicon.

In this manner, the structure shown in FIG. 1D is completed. Cutting allowance areas Ct defined by the broken lines are removed, thereby yielding individual devices.

In each laser irradiation in FIG. 1B, stress is not generated in a laser-unirradiated area, so that a crack is not formed in the epitaxial layer 10 in the laser-unirradiated area. This is described below with reference to FIG. 2.

FIG. 2A is a sectional view showing a state in which an expanded device area A2 is under laser irradiation. FIG. 2B is a sectional view showing a state in which an expanded device area A3 is under laser irradiation.

As shown in FIG. 2A, four expanded device areas are denoted by A1, A2, A3, and A4. Similarly, three stress relaxation areas are denoted by B2, B3, and B4. The expanded device area A1 and the stress relaxation area B2 are separated by a trench tr1b, and the stress relaxation area B2 and the expanded device area A2 are separated by a trench tr2a. The expanded device area A2 and the stress relaxation area B3 are separated by a trench tr2b, and the stress relaxation area B3 and the expanded device area A3 are separated by a trench tr3a. The expanded device area A3 and the stress relaxation area B4 are separated by a trench tr3b, and the stress relaxation area B4 and the expanded device area A4 are separated by a trench tr4a. Suppose that a laser shot (LS) is performed four times in such a manner as to sequentially encompass the expanded device area A1, a combined area of the stress relaxation area B2 and the expanded device area A2, a combined area of the stress relaxation area B3 and the expanded device area A3, and a combined area of the stress relaxation area B4 and the expanded device area A4.

In FIG. 2A, the expanded device area A1 has already been laser-irradiated; the stress relaxation area B2 and the expanded device area A2 are under laser irradiation; and the stress relaxation areas B3 and B4 and the expanded device areas A3 and A4 are laser-unirradiated.

At this time, nitrogen gas is generated as a result of decomposition of a portion of the n-type layer 11 in the stress relaxation area B2 and the expanded device area A2 in the vicinity of the interface between the n-type layer 11 and the epitaxial growth substrate 100. The generated nitrogen gas is discharged through the trenches tr1b, tr2a, and tr2b. At this time, very large volume expansion of the nitrogen gas occurs. The epitaxial layer 10 in the expanded device area A1 to the left of the expanded device area A2 under laser irradiation is separated from the epitaxial growth substrate 100. Thus, the epitaxial layer 10 in the expanded device area A1 is free from imposition of large stress thereon. By contrast, since the epitaxial layer 10 in the stress relaxation area B3 to the right of the expanded device area A2 under laser irradiation is bonded to the epitaxial growth substrate 100, large stress is imposed on the epitaxial layer 10 in the stress relaxation area B3. However, the stress does not directly reach the expanded device area A3 to the right of the stress relaxation area B3. Thus, a possibility of crack formation is low at a portion, in the vicinity of the trench tr3a, of the epitaxial layer 10 in the expanded device area A3 to the right of the expanded device area A2 under laser irradiation. Therefore, no crack reaches a product device area encompassed by the expanded device area A3, so that device characteristics are not impaired.

Next, referring to FIG. 2B, the expanded device area A2 has already been laser-irradiated, and thus the epitaxial layer 10 in the expanded device area A2 is separated from the epitaxial growth substrate 100. Thus, although nitrogen gas is generated as a result of decomposition of a portion of the n-type layer 11 in the stress relaxation area B3 and the expanded device area A3 in the vicinity of the interface between the n-type layer 11 and the epitaxial growth substrate 100, the influence of the generated nitrogen gas on the epitaxial layer 10 in the expanded device area A2 is little.

The present invention has been described with reference to only the sectional views. Now, the present invention will be described with reference to plan views.

FIG. 3 is a schematic plan view showing the array of expanded device areas A11 to A34 and stress relaxation areas B12 to B34, C11 to C44, and D12 to D44. In FIG. 3, an area DN where the n-type layer 11 is separated from the epitaxial growth substrate 100 is marked with hatching of widely spaced parallel lines, and an area UD where the n-type layer 11 is bonded to the epitaxial growth substrate 100 is marked with hatching of narrowly spaced parallel lines extending from the upper left to the lower right.

In FIG. 3, the expanded device area A22 and the stress relaxation areas B22, C22, and D22 are subjected to the latest laser irradiation, and only these areas are marked with hatching of widely spaced parallel lines extending from the upper left to the lower right. The area DN excluding these areas; i.e., a portion of the area DN which has been separated from the epitaxial growth substrate 100 by previously performed laser irradiation, is marked with hatching of widely spaced parallel lines extending from the upper right to the lower left.

FIG. 3 is a planar representation of FIGS. 2A and 2B. Trenches in parallel with one of two mutually perpendicular directions divide the epitaxial layer 10 into the expanded device areas A11 to A34 each having a rectangular shape and the stress relaxation areas B12 to B34, C11 to C44, and D12 to D44 each having a rectangular shape. A strip-shaped area BB encompassed by the area UD, where the n-type layer 11 is bonded to the epitaxial growth substrate 100, is formed at the boundary between the area DN, which is marked with hatching of widely spaced parallel lines and where the n-type layer 11 is separated from the epitaxial growth substrate 100, and the area UD, which is marked with hatching of narrowly spaced parallel lines and where the n-type layer 11 is bonded to the epitaxial growth substrate 100. In FIG. 3, the strip-shaped area BB consists of the stress relaxation areas C31, D32, C32, D33, B23, D23, C23, D24, and C24, which are laser-unirradiated areas where the epitaxial growth substrate 100 remains bonded.

Thus, stress induced by nitrogen gas generated as a result of the expanded device area A22 and the stress relaxation areas B22, C22, and D22 being laser-irradiated does not reach the expanded device area A31, where the epitaxial growth substrate 100 remains bonded, by virtue of the stress relaxation areas C31 and D32, where the epitaxial growth substrate 100 remains bonded; the stress does not reach the expanded device area A32, where the epitaxial growth substrate 100 remains bonded, by virtue of the stress relaxation areas D32, C32, and D33, where the epitaxial growth substrate 100 remains bonded; the stress does not reach the expanded device area A33, where the epitaxial growth substrate 100 remains bonded, by virtue of the stress relaxation area D33, where the epitaxial growth substrate 100 remains bonded; and the stress does not reach the expanded device area A23, where the epitaxial growth substrate 100 remains bonded, by virtue of the stress relaxation areas D33, B23, D23, and C23, where the epitaxial growth substrate 100 remains bonded.

Meanwhile, the stress induced by nitrogen gas generated as a result of the expanded device area A22 and the stress relaxation areas B22, C22, and D22 being laser-irradiated has little influence on the expanded device areas A11, A12, and A21, where the epitaxial growth substrate 100 is debonded.

FIG. 3 assumes the following laser irradiation practice. In row i, a laser irradiation area of a single laser shot consists of an expanded device area Aij and stress relaxation areas Bij, Cij, and Dij. Laser irradiation is repeated such that j is varied from 1 (the left side in FIG. 3) to 4 (the right side in FIG. 3). This practice of laser irradiation is repeated such that i is varied from 1 (the top side in FIG. 3) to 4 (the bottom side in FIG. 3). In any laser irradiation, the strip-shaped area BB consists of the stress relaxation areas C(i+1, 1), D(i+1, 2), . . . , D(i+1, j), C(i+1, j), D(i+1, j+1), B(i, j+1), D(i, j+1), C(i, j+1), . . . , D(i, 4), and C(i, 4). Thus, the logic of the above-described case of irradiation of the expanded device area A22 with laser light holds with the entire wafer. That is, according to the present invention, stress is not imposed directly on the expanded device areas where the epitaxial growth substrate 100 remains bonded, by virtue of the presence of the stress relaxation areas where the epitaxial growth substrate 100 remains bonded.

Figure 4:
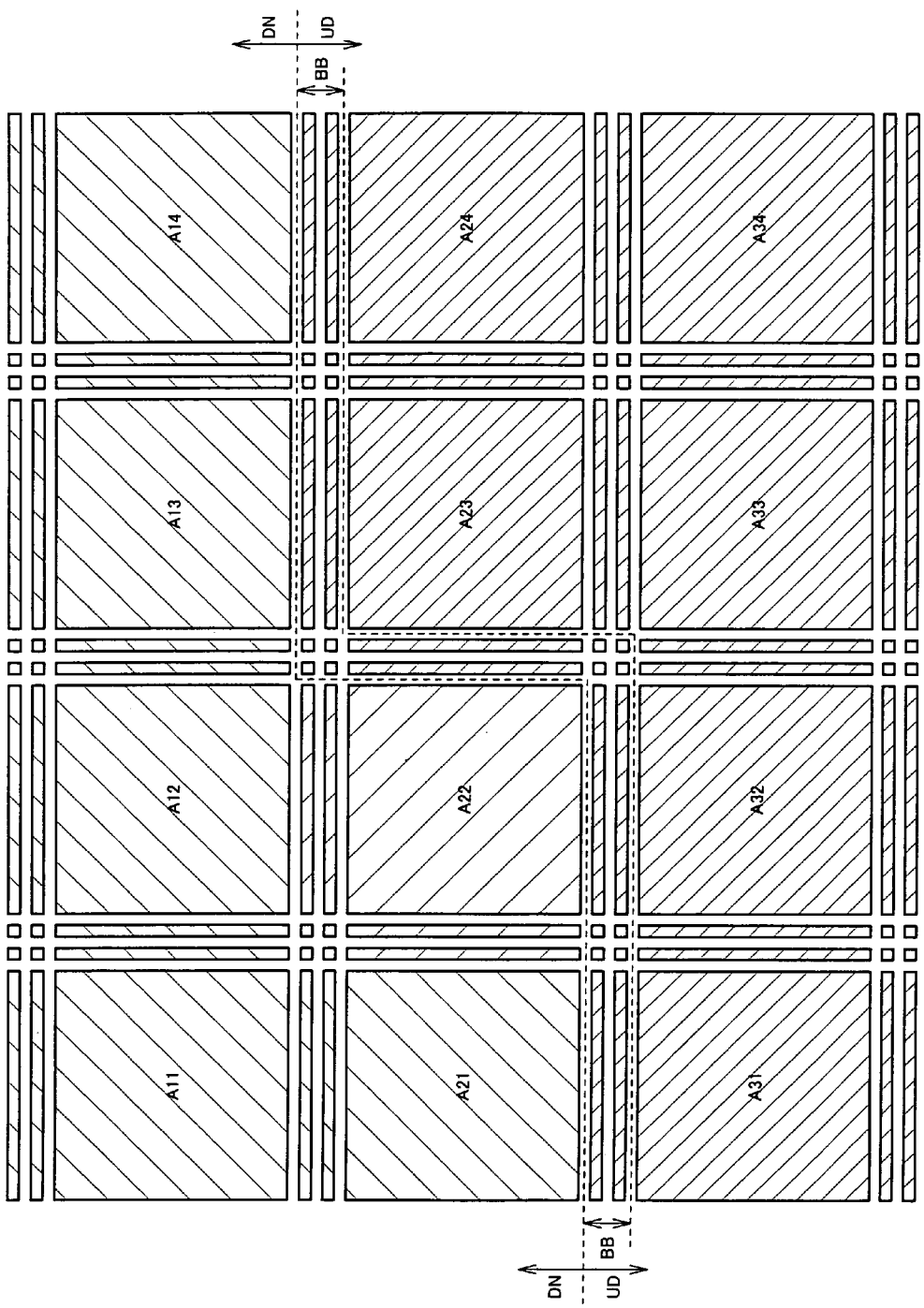
FIG. 4 is a plan view showing another example array of expanded device areas and stress relaxation areas.

FIG. 4 corresponds to the third aspect of the present invention in which the stress relaxation area located between every two adjacent expanded device areas consists of n rectangular areas juxtaposed between the adjacent expanded device areas, where n is two. FIG. 4 is similar to FIG. 3, except that each of the stress relaxation areas is split. Similar to FIG. 3, the area DN, where the n-type layer 11 is separated from the epitaxial growth substrate 100, is marked with hatching of widely spaced parallel lines; the area UD, where the n-type layer 11 is bonded to the epitaxial growth substrate 100, is marked with hatching of narrowly spaced parallel lines extending from the upper left to the lower right; the expanded device area A22 and its peripheral area are subjected to the latest laser irradiation and marked with hatching of widely spaced parallel lines extending from the upper left to the lower right; and a portion of the area DN which has been separated from the epitaxial growth substrate 100 by previously performed laser irradiation is marked with hatching of widely spaced parallel lines extending from the upper right to the lower left. The strip-shaped area BB encompassed by the area UD is formed at the boundary between the area DN and the area UD. The strip-shaped area BB can be said to be formed such that the stress relaxation areas are arrayed in a twofold strip fashion. It is apparent that the number of juxtaposed strips depends on the value of n; i.e., the stress relaxation areas are arrayed in an n-fold strip fashion. The above-mentioned configuration will next be described in detail with reference to FIGS. 5A and 5B.

Figures 5A, 5B:
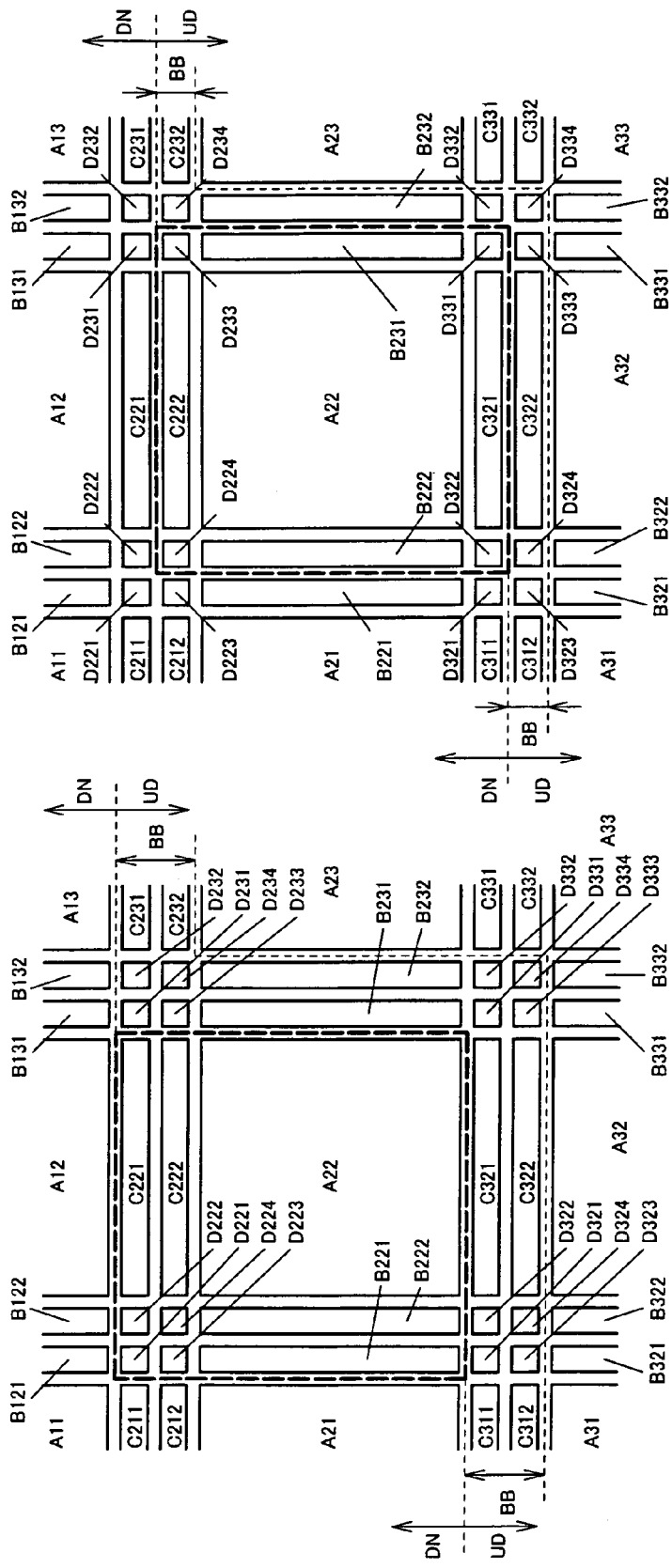
FIG. 5A is a plan view showing the details of FIG. 4.
FIG. 5B is a plan view showing a modification of FIG. 5A.

FIG. 5A is an expanded plan view showing the expanded device area A22 and its peripheral area of FIG. 4 which have been subjected to the latest laser irradiation. FIG. 5A shows only the positional relationship among the areas while the scale is ignored.

The areas which are subjected to the latest laser irradiation are surrounded by the thick broken line and are the expanded device area A22 and stress relaxation areas B221 and B222, C221 and C222, and D221, D222, and D223 and D224. Other areas encompassed by the area DN, where the epitaxial growth substrate 100 is separated, are the expanded device areas A11, A12, A13, and A21 and the stress relaxation areas B121 and B122, B131 and B132, and C211 and C212.

Areas encompassed by the area UD, where the epitaxial growth substrate 100 remains bonded, are the expanded device areas A23, A31, A32, and A33 and stress relaxation areas B231 and B232, B321 and B322, B331 and B332, C231 and C232, C311 and C312, C321 and C322, C331 and C332, and D231, D232, D233 and D234, D321, D322, D323 and D324, D331, D332, and D333 and D334. Among these areas, the following areas constitute the strip-shaped area BB: the stress relaxation areas C311 and C312, the stress relaxation areas D321, D322, D323, and D324, the stress relaxation areas C321 and C322, the stress relaxation areas D331, D332, D333, and D334, the stress relaxation areas B231 and B232, the stress relaxation areas D231, D232, D233, and D234, and the stress relaxation areas C231 and C232. As is apparent from FIG. 5A, the strip-shaped area BB is configured such that the stress relaxation areas are arrayed in a twofold strip fashion. The strip-shaped area BB configured such that the stress relaxation areas are arrayed in a multifold strip fashion can further reduce stress to be imposed on the epitaxial layer bonded to the epitaxial growth substrate in the laser-unirradiated expanded device areas.

Laser irradiation may be performed as shown in FIG. 5B. Specifically, areas which are subjected to the latest laser irradiation are surrounded by the thick broken line and are the expanded device area A22 and the stress relaxation areas D224, C222, D233, B231, D331, C321, D322, and B222. Other areas encompassed by the area DN, where the epitaxial growth substrate 100 is separated, are the expanded device areas A11, A12, A13, and A21 and the stress relaxation areas B121 and B122, B131 and B132, and B221, C211 and C212, C221, C231, and C311, and D321, D223, D221, D222, D231, and D232.

Areas encompassed by the area UD, where the epitaxial growth substrate 100 remains bonded, are the expanded device areas A23, A31, A32, and A33 and the stress relaxation areas B232, B321 and B322, and B331 and B332, C232, C312, C322, and C331 and C332, and D234, D323 and D324, D332, and D333 and D334. Among these areas, the following areas constitute the strip-shaped area BB: the stress relaxation area C312, the stress relaxation areas D323 and D324, the stress relaxation area C322, the stress relaxation areas D333, D334, and D332, the stress relaxation area B232, the stress relaxation area D234, and the stress relaxation area C232. By contrast to FIG. 5A, the strip-shaped area BB in FIG. 5B is configured such that the stress relaxation areas are arrayed in a onefold strip fashion.

The stress relaxation areas D321, B221, D223, D221, D222, C221, D231, and D232 encompassed by the area DN, where the epitaxial growth substrate 100 is separated, function to reduce the influence of stress induced by nitrogen gas which is generated instantaneously in a large amount from the laser-irradiated area surrounded by the thick broken line, on the expanded device areas A21, A11, A12, and A13.

In the above description, a laser beam is scanned across a row of areas from the left to the right and from the top row to the bottom row; for example, in FIG. 3, the laser beam is scanned rightward across the top row from A11 to A14, then across the next lower row from A21 to A24, and so on. However, the laser beam may be scanned from the right to the left, or left-to-right scanning and right-to-left scanning may alternate. Even in these cases, the strip-shaped area BB consisting of the stress relaxation areas must be formed in a laser-unirradiated area.

Figure 6:
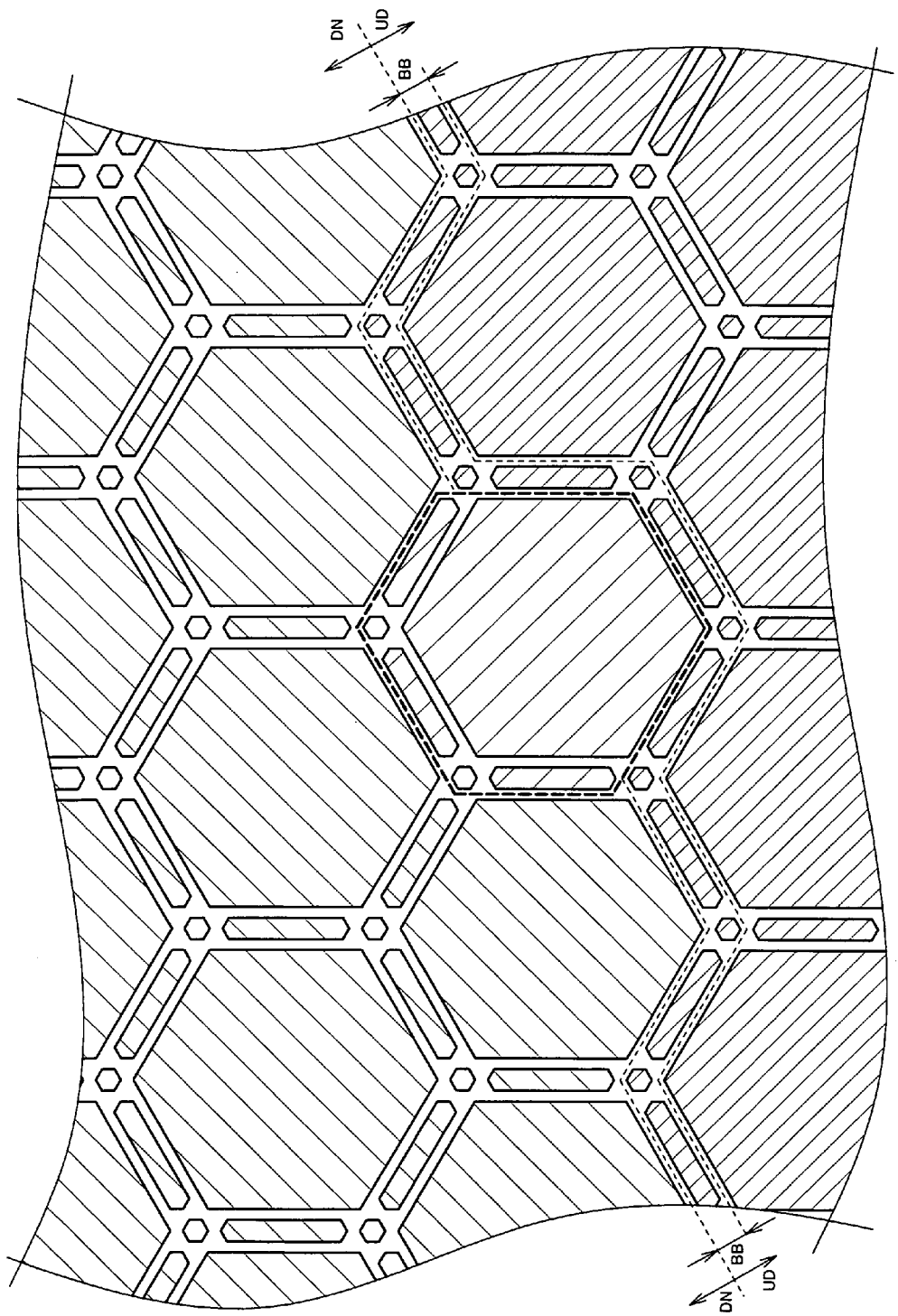
FIG. 6 is a plan view showing still another example array of expanded device areas and stress relaxation areas.
Figure 7A:
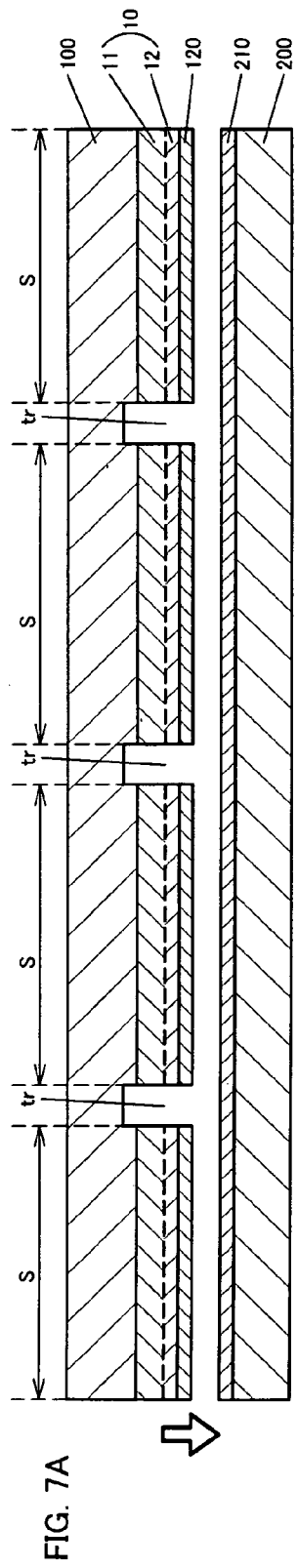
FIGS. 7A to 7D are sectional views showing a conventional process.
Figure 7B:
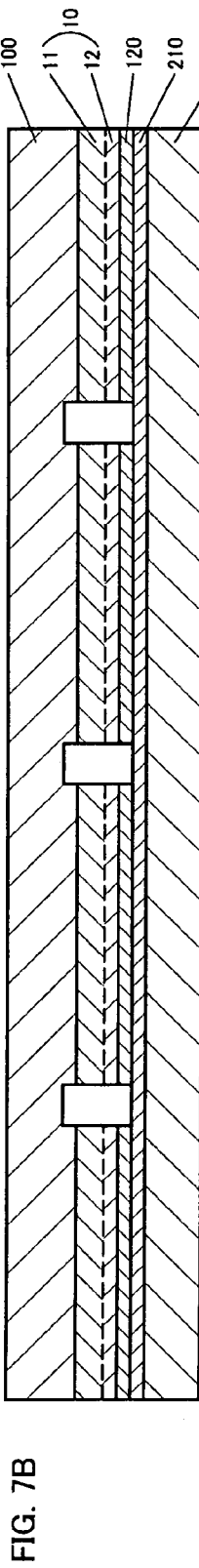
Figure 7C:
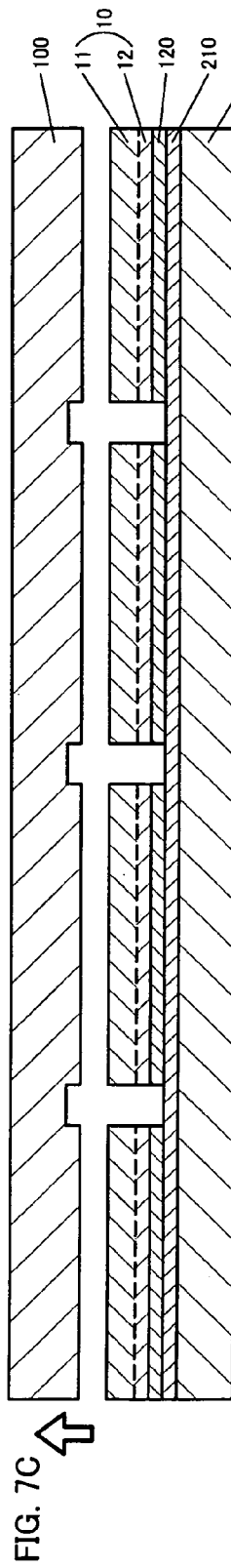
Figure 7D:
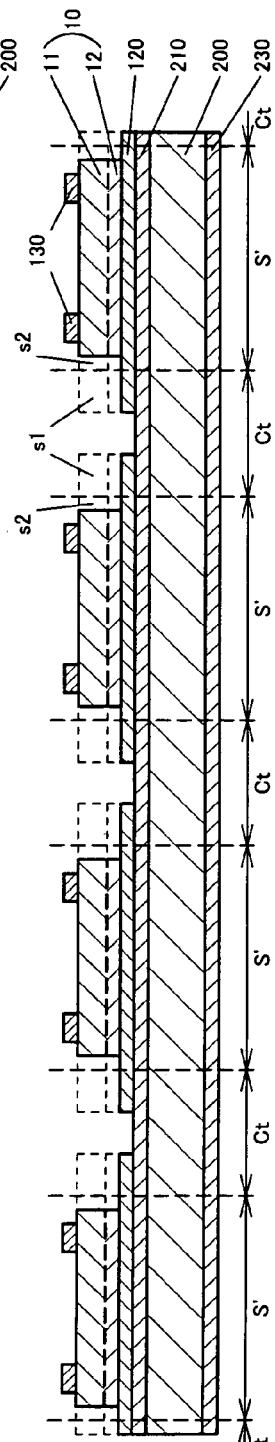
Figure 8A:
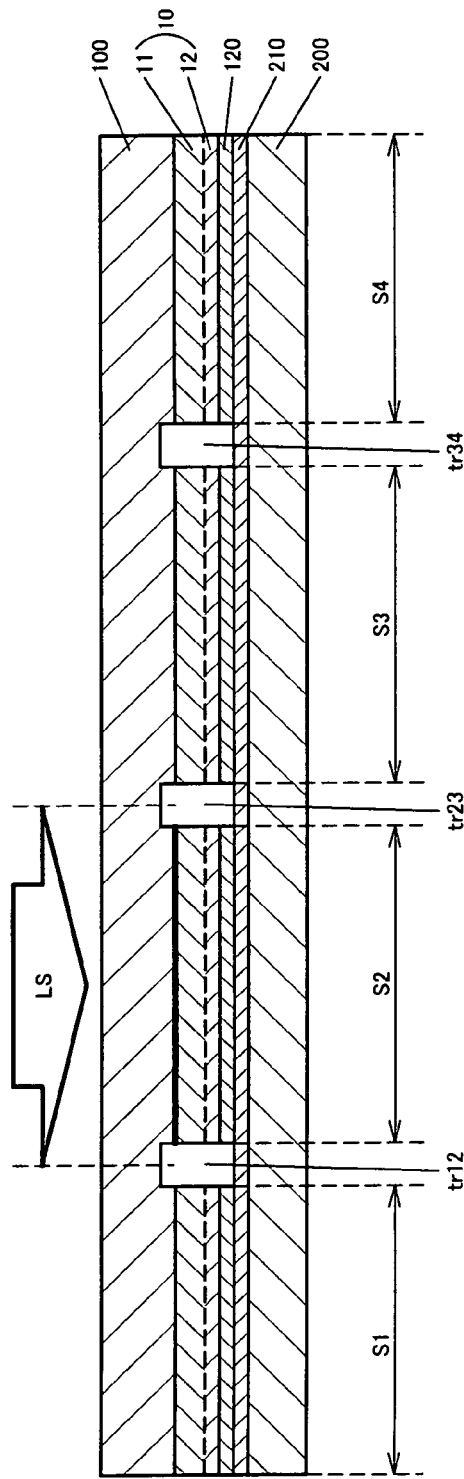
FIGS. 8A and 8B are sectional views showing the details of FIG. 7B.
Figure 8B:
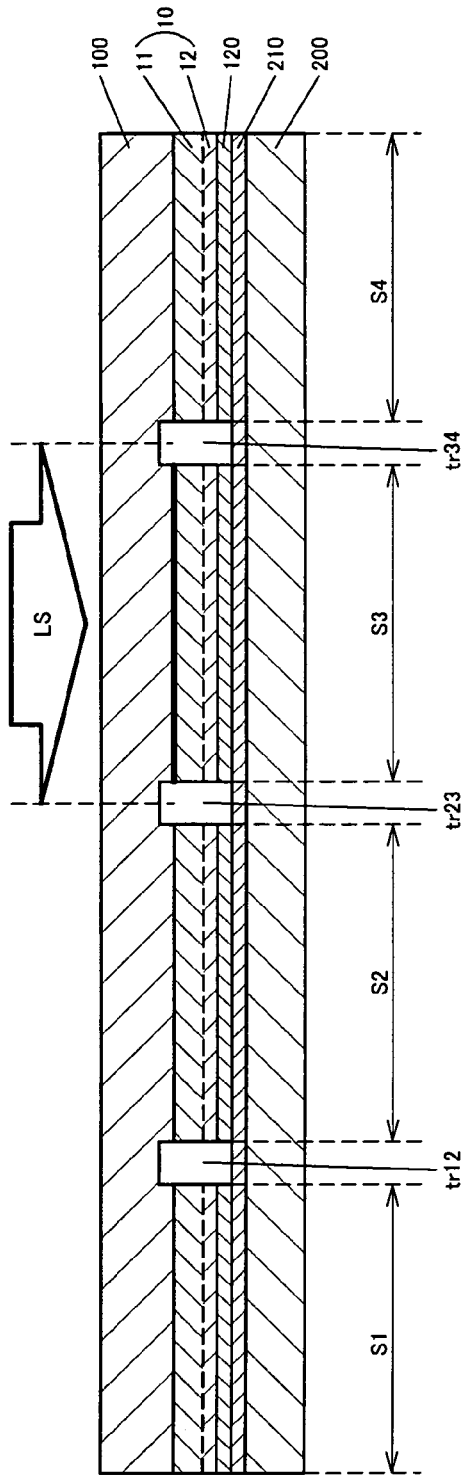

The present invention can be applied such that each of the expanded device areas has a desired polygonal shape. FIG. 6 shows an example case where each of the expanded device areas has a hexagonal shape. In FIG. 6, hatching and other configurational features are similar to those of FIG. 3.

A known technique can be employed for forming trenches which serve as discharge paths for nitrogen gas generated in association with laser irradiation for laser lift-off and which divide an epitaxial layer into expanded device areas and stress relaxation areas. Examples of such a technique include dicing by a dicer, etching through blasting, laser machining, and other etching processes. The width of a trench may be 5 μm to 50 μm inclusive. The width of a stress relaxation area may be 5 μm to 50 μm inclusive. In the case where the stress relaxation areas are arrayed in an n-fold fashion, the width of each of the stress relaxation areas may be 5 μm to 50 μm inclusive. The total width of trenches and stress relaxation areas present between two adjacent expanded device areas is preferably equal to or smaller than the width of a cutting allowance area and is generally 15 μm to 200 μm, preferably 30 μm to 100 μm inclusive.

Any cutting method can be applied to a process of cutting a support substrate for yielding product devices. In the cutting process, small pieces of conductive layers of metal or the like and of the conductive support substrate may scatter and adhere to devices. In order to cope with the problem, an insulating protection film may be formed to prevent a short circuit between a p-type layer and an n-type layer, which could otherwise result from cutting of the support substrate. A large number of choices are available for selection of technique for such cutting. Examples of a preferred cutting method include a combination of half cutting by use of a dicer or the like and mechanical cutting, and decomposition by laser irradiation.

The fabrication method may include a process of thinning the epitaxial growth substrate and the support substrate.

EXAMPLES

Example 1

Blue light-emitting diodes (LEDs) were fabricated in the following manner. The steps of fabrication are as shown in FIGS. 1A to 1D. However, accurately speaking, the expanded device areas and the stress relaxation areas were formed as shown in FIG. 4. Also, laser irradiation was performed on the expanded device areas and the stress relaxation areas as shown in FIG. 5B.

An n-type layer 11 and then a p-type layer 12 were epitaxially grown on an epitaxial growth substrate 100 of sapphire having a thickness of 500 μm, thereby forming an epitaxial layer 10. A light-emitting area L was formed % in an MQW structure, but is merely represented by the thick broken line in FIGS. 1A to 1D.

Next, trenches tr were formed by laser irradiation in the following manner, for use as air vents at the time of laser lift-off. A silicon oxide ($SiO_2$) film was formed on the entire surface of the p-type layer 12, which was the top layer of the epitaxial layer 10. Subsequently, the trenches tr were formed by use of YAG laser (output 8 W). The trenches tr were formed in such a manner as to extend through the p-type layer 12 and the n-type layer 11 having a total thickness of about 4 μm and to penetrate about 10 μm into the epitaxial growth substrate 100. Each of the trenches tr had a width of about 15 μm. A stress relaxation area B intervening between two trenches tr had a width of 20 μm. Subsequently, by means of treatment with a mixed solution of sulfuric acid and hydrogen peroxide, gallium and other metals remaining after fusion by laser were removed. Then, by means of treatment with buffered hydrofluoric acid (BHF), the silicon oxide ($SiO_2$) film which covered the p-type layer 12 was removed. In this manner, the trenches tr divided the epitaxial layer 10 into expanded device areas A and stress relaxation areas B. Accurately speaking, the expanded device areas and the stress relaxation areas were formed as shown in FIG. 4. That is, the trenches tr were formed in a threefold fashion, and the stress relaxation areas were formed in a twofold fashion.

Next, a conductive multilayer film 120 was formed on the surface of the p-type layer 12 in the following manner.

First, an Ag alloy layer was formed on the entire surface of the p-type layer 12 by use of a sputtering apparatus; a resist mask was formed on the Ag alloy layer, and then unnecessary portions of the Ag alloy layer were removed; the resist mask was removed; subsequently, a p contact electrode was formed through application of heat for alloying. Next, a Ti layer, a TiN layer, a Ti layer, an Ni layer, and an Au layer were sequentially formed on the entire surface by use of the sputtering apparatus.

Also, an AuSu layer and an Au layer were formed as a solder layer on the entire surface by use of a resistance heating evaporation apparatus. The finally formed Au layer is a thin film for preventing oxidation of tin (Sn). Thus was formed the conductive multilayer film 120 having a stacked structure which consists of the contact electrode of an Ag alloy, a five-layer structure consisting of the Ti layer, the TiN layer, the Ti layer, the Ni layer, and the Au layer, and a solder layer consisting of the AuSn layer and the Au layer.

In formation of the conductive multilayer film 120, the conductive multilayer film 120 may cover the previously formed trenches tr, so long as the trenches tr can serve as air vents for outward communication, or outward communication can be established at the time of laser irradiation for laser lift-off. Specifically, the conductive multilayer film 120 may be formed on the bottom of each of the trenches tr, but is not formed on the side wall of the trench tr, or, even when the conductive multilayer film 120 is formed on the side wall, it is very thin. Thus, even when the conductive multilayer film 120 is formed in a communication path for discharging, to the trench tr, nitrogen gas generated in the vicinity of the interface between the n-type layer 11 and the epitaxial growth substrate 100, the generated nitrogen gas can readily remove the blocking conductive multilayer film 120, so that the generated nitrogen gas can be readily discharged. In this manner, there was formed a wafer which had the trenches tr and in which the epitaxial layer 10 and the conductive multilayer film 120 were formed on the epitaxial growth substrate 100 (equivalent to the stacked structure appearing on the upper side of FIG. 1A). Next, by use of the resistance heating evaporation apparatus, a three-layer structure consisting of Ti, Ni, and Au layers, and a solder layer consisting of an AuSn layer and an Au layer were formed on the entire surface of a support substrate 200 of silicon having a thickness of 500 μm, thereby forming a conductive multilayer film 210 (equivalent to the stacked structure appearing on the lower side of FIG. 1A).

The epitaxial growth substrate 100 having the epitaxial layer 10, and the support substrate 200 were bonded together such that the conductive multilayer films 120 and 210, whose top layers were solder layers, faced each other (equivalent to the stacked structure appearing in FIG. 1B). The heating temperature was 320° C., and pressure was 196 kPa (about 2 atmospheres, 2 kgf/cm$^2$).

In FIGS. 1A to 1D, the conductive multilayer film 120 and the conductive multilayer film 210 are shown as two individual films. However, the two thin Au films sandwiched between the two AuSn layers of the conductive multilayer films 120 and 210 are absorbed by the AuSn layers, and the individually formed two AuSn layers are formed into a single AuSn layer.

Next, laser lift-off was performed in the following manner. A thin-film portion of the n-type layer 11 of the epitaxial layer 10 in the vicinity of the interface between the n-type layer 11 and the epitaxial growth substrate 100 (sapphire substrate) was irradiated with laser light so as to decompose the thin-film portion of the n-type layer 11. At this time, the laser irradiation area was a square area measuring one mm square which encompassed one of square chips to be formed at intervals of one mm. In this manner, the entire thin-film portion of the n-type layer 11 in the vicinity of the interface between the n-type layer 11 and the epitaxial growth substrate 100 of sapphire was decomposed for debonding, thereby removing the epitaxial growth substrate 100 (equivalent to FIG. 1C). Accurately speaking, laser irradiation was performed on the expanded device areas and the stress relaxation areas as shown in FIG. 5B.

Next, chip peripheries a1 and a2 of the epitaxial layer 10 were removed by dry etching which used an SiO$_2$ mask formed by CVD. By use of a resist mask, an Al layer, a Ti layer, an Ni layer, and an Au layer were sequentially stacked in required areas, thereby forming n electrodes 130.

The back side of the support substrate 200 of silicon was ground for thinning. A conductive layer consisting of a Pt layer, a Ti layer, and an Au layer, and a solder layer consisting of an AuSn layer and an Au layer were deposited on the ground surface, thereby forming a conductive multilayer film 230.

A device structure was thus completed (equivalent to FIG. 1D). Cutting allowance areas Ct defined by the broken lines were removed, thereby yielding individual devices.

The Group III nitride-based compound semiconductor devices (blue LEDs), each measuring 1 mm square, yielded as mentioned above from a single epitaxial growth substrate 100 (support substrate 200) were tested for the incidence of a back-current defect. When a reverse voltage of 5 V was applied to a certain LED; i.e., when the electric potential of the n electrode 130 was rendered 5 V higher than that of the back side of the silicon substrate of the LED; i.e., 5 V higher than that on the p-electrode side of the LED, the LED having a current of 2 μA or greater was judged to be a defective LED having back current. The incidence of a back-current defect was 2%; i.e., the pass rate was 98%, indicating a very high yield.

Comparative Example

For comparison, Group III nitride-based compound semiconductor devices (blue LEDs) were fabricated similarly except that a single trench was formed between adjacent devices; i.e., no stress relaxation area was formed. 30% of the LEDs yielded from a single epitaxial growth substrate 100 (support substrate 200) suffered a back-current defect; i.e., the pass rate was 70%, indicating a very low yield.

What is claimed is:

1. A method for producing a Group III nitride-based compound semiconductor device in which a hetero-substrate is used as an epitaxial growth substrate, said method comprising:

stacking an epitaxial layer of a Group III nitride-based compound semiconductor on the epitaxial growth substrate;

bonding a support substrate to a top surface of the epitaxial layer via a conductive layer;

removing the epitaxial growth substrate by a laser lift-off; and before bonding the support substrate to the epitaxial layer formed on the epitaxial growth substrate, forming trenches in such a manner as to extend from a top surface of a stacked structure including the epitaxial layer formed on the epitaxial growth substrate to at least an interface between the epitaxial growth substrate and a bottom surface of the epitaxial layer, wherein the trenches are formed in at least three lines and divide the epitaxial layer formed on the epitaxial growth substrate into expanded device areas which encompass respective product device structures, and stress relaxation areas, and wherein a plurality of laser irradiations are performed for the laser lift-off such that, after each laser irradiation, the expanded device areas and the stress relaxation areas are separated into a laser-irradiated area and a laser-unirradiated area, and a strip-shaped laser-unirradiated stress relaxation area is formed at a boundary between the laser-irradiated area and the laser-unirradiated area.

2. A method for producing a Group III nitride-based compound semiconductor device according to claim 1, wherein longitudinal directions of the trenches are in parallel with two mutually perpendicular directions.

3. A method for producing a Group III nitride-based compound semiconductor device according to claim 2, wherein the trenches are formed in (n+1) lines, and a stress relaxation area located between every two adjacent expanded device areas comprises n island-like rectangular areas juxtaposed between the adjacent expanded device areas, where n is an integer equal to or larger than 2.

4. A method for producing a Group III nitride-based compound semiconductor device according to claim 3, wherein a plurality of laser irradiations are performed for the laser lift-off such that, in each laser irradiation, a stress relaxation area which has been laser-irradiated is present between an expanded device area under laser irradiation and an expanded device area which has been laser-irradiated.

* * * * *